US007414190B2

(12) United States Patent
Vo (10) Patent No.: US 7,414,190 B2
(45) Date of Patent: *Aug. 19, 2008

(54) ENVIRONMENTAL SEAL FOR NETWORK INTERFACE DEVICE

(75) Inventor: Chanh C. Vo, Mansfield, TX (US)

(73) Assignee: Corning Cable Systems LLC, Hickory, NC (US)

( * ) Notice: Subject to any disclaimer, the term of this patent is extended or adjusted under 35 U.S.C. 154(b) by 66 days.

This patent is subject to a terminal disclaimer.

(21) Appl. No.: 10/983,797

(22) Filed: Nov. 8, 2004

(65) Prior Publication Data

US 2006/0096774 A1 May 11, 2006

(51) Int. Cl.
*H02G 3/08* (2006.01)

(52) U.S. Cl. .............................. 174/50; 174/58; 174/63; 220/3.2; 220/4.02

(58) Field of Classification Search .................. 174/50, 174/53, 58, 17 R, 650, 480, 481, 17 CT, 63, 174/135; 220/3.2–3.9, 4.02; 439/535; 248/906
See application file for complete search history.

(56) References Cited

U.S. PATENT DOCUMENTS

| 3,618,804 | A | | 11/1971 | Krause | 220/3.8 |
| 3,910,448 | A | * | 10/1975 | Evans et al. | 174/50 |
| 5,199,239 | A | * | 4/1993 | Younger | 174/481 |
| 5,248,849 | A | | 9/1993 | Schulte et al. | 174/65 R |
| 5,310,075 | A | * | 5/1994 | Wyler | 174/50 |
| 5,959,250 | A | * | 9/1999 | Daoud | 174/135 |
| 6,444,906 | B1 | | 9/2002 | Lewis | 174/53 |
| 6,545,217 | B2 | * | 4/2003 | Sato | 174/50 |
| 6,727,429 | B1 | * | 4/2004 | Koessler | 174/50 |
| 6,768,054 | B2 | * | 7/2004 | Sato et al. | 174/50 |
| 6,815,612 | B2 | * | 11/2004 | Bloodworth et al. | 174/50 |
| 6,891,104 | B2 | * | 5/2005 | Dinh | 174/50 |

* cited by examiner

*Primary Examiner*—Angel R Estrada
(74) *Attorney, Agent, or Firm*—C. Keith Montgomery (57) ABSTRACT

A NID includes a base defining an interior cavity and a protective outer cover attached to the base for movement between an opened position and a closed position. At least one of the base and the outer cover has one or more channels formed therein and the other of the base and the outer cover has one or more lips that depend outwardly therefrom. Each lip is received within a corresponding channel formed on the other of the base and the outer cover. The lip and the channel have side portions that engage at multiple contact points to form an environmental seal that prevents contaminants, such as wind-driven dust, sand and moisture, from entering the interior cavity when the outer cover is in the closed position, thereby protecting communications equipment within the NID without the use of an elastomeric gel, seal or gasket.

7 Claims, 7 Drawing Sheets

ENVIRONMENTAL SEAL FOR NETWORK INTERFACE DEVICE

FIELD OF THE INVENTION

The invention relates generally to an enclosure for protecting communications equipment from adverse environmental conditions. More particularly, the invention is an environmental seal for an outdoor network interface device (NID) that protects termination equipment at a subscriber premises from wind-driven dust, sand and rain.

BACKGROUND OF THE INVENTION

Communications service providers, such as telephone companies, are required to provide a demarcation between the service provider's incoming wiring, referred to herein as the feeder cable, and the subscriber wiring, referred to herein as the distribution cable, at the subscriber premises. The demarcation is typically provided by termination equipment housed within an enclosure, referred to herein as a network interface device (NID), mounted outside the subscriber premises. As a result, the NID is exposed to adverse environmental conditions, such as wind-driven dust, sand and wind. The NID includes a base mounted to a wall or other structure outside the subscriber premises and a protective outer cover attached to the base that is movable between a closed position and an opened position. The NID also provides direct access to the wiring connections between the network and the subscriber for installation, reconfiguration and test operations. The termination equipment, such as one or more line modules, protected terminating devices (PTDs) or electronic Printed Circuit Boards (PCBs), is mounted on the base within an interior cavity defined by the NID. In many instances, the NID also includes a lockable inner cover that prevents unauthorized access to the service provider's portion of the termination equipment.

The outer cover protects the termination equipment and the wiring connections within the NID from adverse environmental conditions, such as moisture, dirt, dust, and infestation. In particular, the outer cover protects the termination equipment and the wiring connections from wind-driven dust, sand and moisture that results from rain, sleet, and melting snow. The NID is typically made of sheet metal or molded plastic material that is formed such that the NID is substantially airtight and watertight. Accordingly, conventional NID designs are capable of protecting the termination equipment and wiring connections in standard dust, sand and rain tests. Recently, however, more severe tests, and in particular the Telcordia GR-49-CORE sand/dust test and the GR-487-CORE wind-driven rain test, have been proposed as a standard requirement for all new outdoor NID products. In most instances, conventional NIDs may be modified to meet these more severe tests with the addition of an elastomeric gel, seal or gasket that is positioned between the mating surfaces of the base and the outer cover. The addition of a gel, seal or gasket, however, typically requires a costly change in the mold tool for the base and/or the outer cover. Furthermore, the addition of a gel, seal or gasket unnecessarily increases the material, manufacturing, and assembly costs associated with the NID.

Thus, it is highly desirable to provide an environmental seal for a NID that protects the termination equipment and the wiring connections housed within the NID from adverse environmental conditions, and in particular, from wind-driven dust, sand and moisture that results from rain, sleet, and melting snow. It is further desirable to provide an environmental seal for a NID that meets a more severe wind-driven dust, sand or rain test. It is still further desirable to provide such an environmental seal without the addition of an elastomeric gel, seal or gasket positioned between the mating surfaces of the base and the outer cover so that a change in the mold tool for the base or the outer cover and the associated increases in manufacturing, material, and assembly costs for the NID are avoided.

SUMMARY OF THE INVENTION

In one embodiment, the invention is an enclosure for protecting terminating equipment and wiring connections against adverse environmental conditions. The enclosure includes a base defining an interior cavity for housing the terminating equipment and wiring connections and a protective outer cover attached to the base for movement between an opened position and a closed position. A channel formed in one of the base and the outer cover extends at least partially around the periphery thereof. A lip depending from the other of the base and the outer cover extends at least partially around the periphery thereof. The lip is received within the channel to form a substantially watertight seal that prevents moisture from entering the interior cavity when the outer cover is in the closed position.

In another embodiment, the invention is an enclosure for protecting communications equipment from adverse environmental conditions at a subscriber premises. The enclosure defines an interior cavity for receiving the communications equipment including a base and a protective outer cover. The base includes a first side wall having a first end and a second end, a second side wall having a first end and a second end, a top wall extending between the first end of the first side wall and the first end of the second side wall, and a bottom wall extending between the second end of the first side wall and the second end of the second side wall. The base defines a channel that extends along the first side wall between the bottom wall and the top wall, along the top wall between the first side wall and the second side wall, and along the second side wall between the top wall and the bottom wall. The outer cover is attached to the base for movement between an opened position providing access to the interior cavity and a closed position. The outer cover includes a lip that is received within the channel when the outer cover is in the closed position to define a substantially watertight seal between the base and the outer cover.

In another embodiment, the invention is a network interface device including a base defining an interior cavity and an outer cover movably attached to the base between an opened position for providing access to the interior cavity and a closed position. A channel is formed in at least a portion of the periphery of the base and a lip depends from at least a portion of the periphery of the outer cover opposite the channel. The lip is received within the channel to prevent moisture from entering the interior cavity defined by the base.

In another embodiment, the invention is a network interface device including a base and an outer cover. The base has a first side wall, a second side wall, a top wall and a bottom wall that define an interior cavity. The outer cover has an outwardly depending lip that continuously engages the base along the first side wall, the top wall and the second side wall to prevent moisture from entering the interior cavity.

In another embodiment, the invention is a network interface device including a base, a protective outer cover, a channel formed in the base and a lip depending outwardly from the outer cover. The base includes a floor, a first side wall, a second side wall, a top wall extending between the first side wall and the second side wall and a bottom wall extending between the first side wall and the second side wall. The floor, the first side wall, the second side wall, the top wall and the bottom wall define an interior cavity. The outer cover is movably attached to the base between an opened position for providing access to the interior cavity defined by the base and a closed position. In the closed position, the outer cover includes a first side wall opposite the first side wall of the base, a second side wall opposite the second side wall of the base, a top wall opposite the top wall of the base, and a bottom wall opposite the bottom wall of the base. The channel extends continuously along substantially the entire length of the first side wall, the top wall and the second side wall of the base, and terminates on the first side wall and the second side wall adjacent the bottom wall of the base. The lip is received within the channel to prevent moisture that accumulates against the lip from entering the interior cavity defined by the base.

In yet another embodiment, the invention is an enclosure for protecting terminating equipment and wiring connections against adverse environmental conditions. The enclosure includes a base defining an interior cavity for housing the terminating equipment and wiring connections and a protective outer cover attached to the base for movement between an opened position and a closed position. One or more channels formed in the base and the outer cover extends at least partially around the periphery thereof. One or more lips depending from the other of the base and the outer cover extends at least partially around the periphery thereof opposite a corresponding channel. The lips are received within the channels to form a substantially airtight and watertight seal that prevents dust, sand and moisture from entering the interior cavity when the outer cover is in the closed position.

In still another embodiment, the invention is a network interface device including a base, a protective outer cover, one or more channels formed in the base and the cover, and one or more lips depending outwardly from the base and the outer cover opposite a corresponding channel. The base includes a floor, a first side wall, a second side wall, a top wall extending between the first side wall and the second side wall, and a bottom wall extending between the first side wall and the second side wall. The floor, the first side wall, the second side wall, the top wall and the bottom wall define an interior cavity. The outer cover is movably attached to the base between an opened position for providing access to the interior cavity defined by the base and a closed position. In the closed position, the outer cover includes a first side wall opposite the first side wall of the base, a second side wall opposite the second side wall of the base, a top wall opposite the top wall of the base, and a bottom wall opposite the bottom wall of the base. The channels extend continuously along substantially the entire length of the first side wall, the top wall and the second side wall of the base, and terminate on the first side wall and the second side wall adjacent the bottom wall of the base. The lips are received within the corresponding channels to prevent wind-driven dust, sand and moisture from entering the interior cavity defined by the base.

BRIEF DESCRIPTION OF THE DRAWINGS

The present invention will be described in conjunction with the accompanying drawings in which like reference numerals represent the same or similar parts in the various views. The drawings, which are incorporated in and constitute a part of this specification, provide further understanding of the invention, illustrate various embodiments of the invention, and, together with the description, help to fully explain the principles and objectives thereof. More specifically.

DETAILED DESCRIPTION OF THE INVENTION

The invention is described more fully hereinafter with reference made to the accompanying drawings, in which preferred embodiments of the invention are shown. The invention may, however, be embodied in many different forms, and therefore, should not be construed as being limited to the particular embodiments shown and described herein. Illustrative embodiments are set forth herein so that this description will be thorough and complete, and will fully convey the intended scope of the claimed invention, while enabling those skilled in the art to make and practice the invention without undue experimentation. Positional terms, such as left, right, top, bottom, front, rear, side, etc., and relative terms, such as substantially, larger, smaller, nearer, farther, etc., are utilized herein for purposes of explanation only, and as such, should not be construed as limiting the scope of the invention or the appended claims in any manner.

Figure 1:
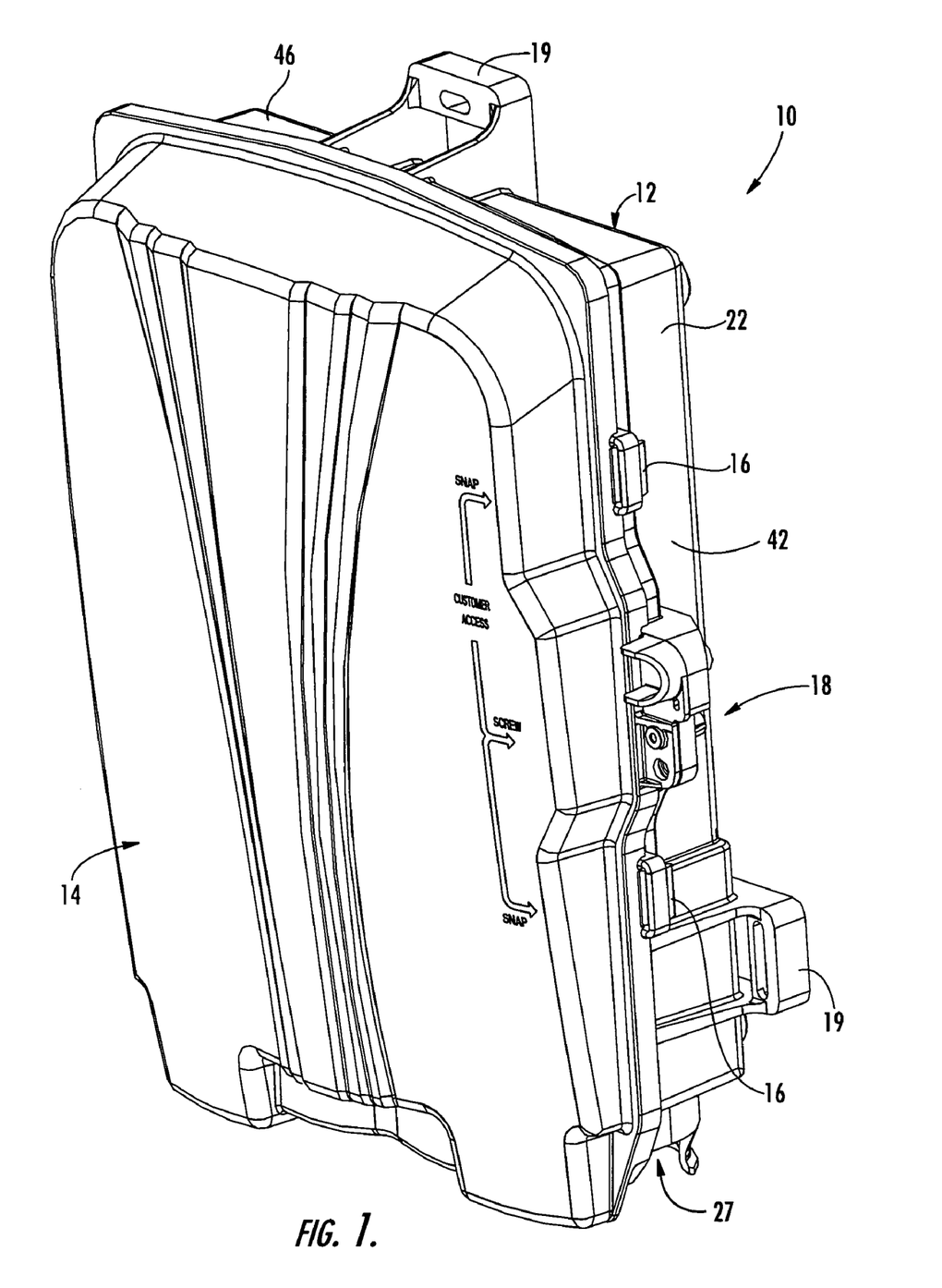
FIG. 1 is a front perspective view of an exemplary NID having an environmental seal constructed in accordance with the invention and shown with the protective outer cover closed.
Figure 2:
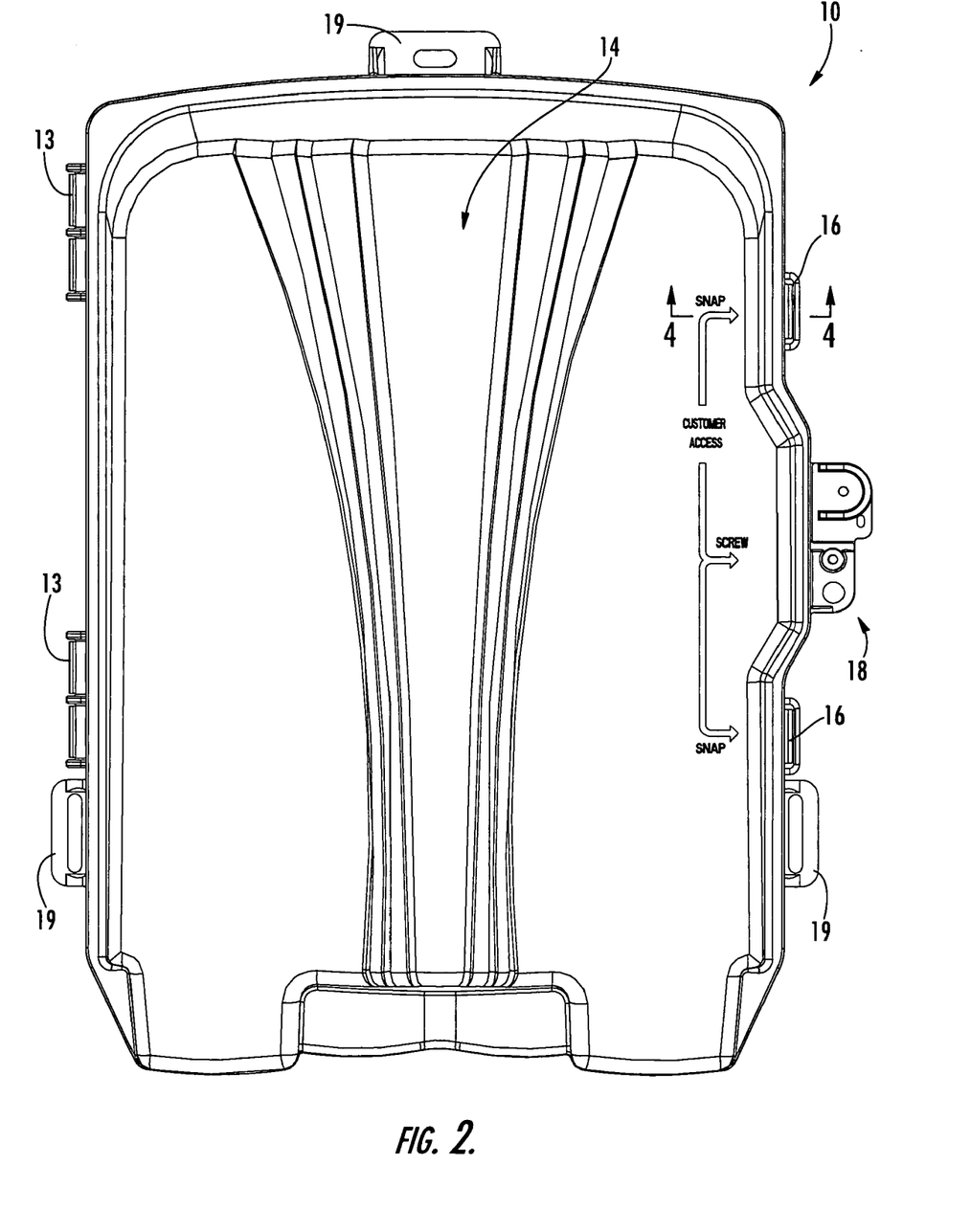
FIG. 2 is a front plan view of the NID of FIG. 1.
Figure 3:
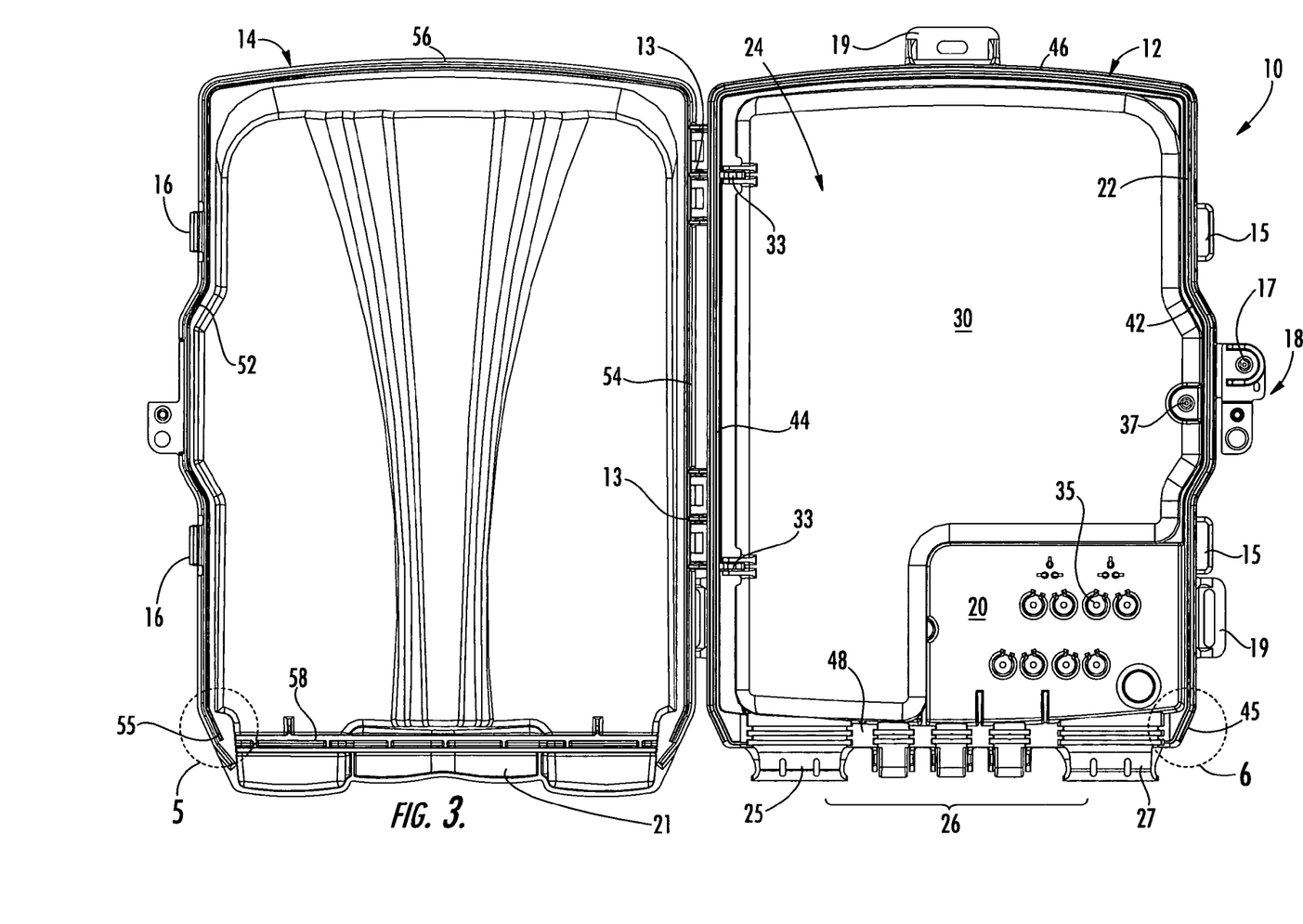
FIG. 3 is a front plan view of the NID of FIG. 1 and shown with the protective outer cover opened.

Referring to the figures, FIGS. 1-3 show a NID, indicated generally at 10, constructed in accordance with one aspect of the invention. The NID 10 comprises a base 12 and a protective outer cover 14 movably attached to the base 12. The base 12 and the outer cover 14 may be made of any relatively rigid material, such as sheet metal, but preferably are made of a molded plastic, such as PVC, polyethylene, polypropylene, polycarbonate, or polybutylene terephthalate (PBT). The outer cover 14 is movable between a closed position, as shown in FIGS. 1 and 2, and an opened position, as shown in FIG. 3. The outer cover 14 may be movably attached to the base 12 in any suitable manner, but preferably is attached to the base 12 by a series of hinges 13 located along one side of the base 12 and the outer cover 14. Accordingly, the outer cover 14 pivots about the hinges 13 between the closed position and the opened position to provide access to an interior cavity defined by the NID 10. As best shown in FIG. 3, the base 12 is provided with hooks 15 and the outer cover 14 is provided with snaps 16 that are received within the hooks 15 to secure the outer cover 14 on the base 12 in the closed position. The base 12 and the outer cover 14 may also be provided with means 18 opposite the hinges 13 for locking the outer cover 14 on the base 12. For example, means 18 may comprise a locking screw 17 that requires an industry specific tool to remove. Furthermore, means 18 may comprise aligned openings through the base 12 and the outer cover 14 that receive a combination or key lock (not shown) belonging to the subscriber. The locking screw 17 permits a field technician from the communications service provider to by-pass the lock belonging to the subscriber, and thereby gain access to the interior of the NID 10 when necessary to service, repair, or reconfigure the NID 10. The base 12 may further comprise one or more feet 19 for mounting the NID 10 in a known manner to a wall or other building structure at the subscriber premises. Typically, the NID 10 is mounted outside the subscriber premises and the outer cover 14 locked on the base 12, as described hereinabove, to prevent unauthorized access to the terminating equipment and the wiring connections housed within the NID 10.

The base 12 of the NID 10 comprises a floor 20 (FIG. 3) and a continuous wall 22 depending upwardly along the periphery of the floor 20. Together, the floor 20 and the wall 22 of the base 12 define an interior cavity 24 for receiving the terminating equipment and wiring connections housed within the NID 10. The wall 22 preferably extends upwardly from the floor 20 a greater distance along the bottom of the NID 10 and the outer cover 14 has a corresponding recess 21 formed therein to form a plurality of entry ports 26 (FIG. 3). Each entry port 26 is in communication with the interior cavity 24 defined by the base 12 to permit electrical and/or fiber optic cables to be routed into the NID 10. The NID 10 may be provided with any convenient number of entry ports 26. Preferably, however, the NID 10 is provided with at least a first port 25 for receiving a feeder cable (not shown) from a communications network and a second port 27 for receiving a distribution cable (not shown) from a subscriber premises. The entry ports 26 may be provided with a removable seal or cap (not shown), or with a grommet having a punch-out pattern, to prevent contaminants, such as moisture, dirt, dust, and infestations, from entering the NID 10 when the entry port 26 is not in use or when a cable is utilized that is smaller in diameter than the entry port 26. When in use, the entry port 26 may also be sealed with a gel or grease around the cable in a known manner to prevent contaminants from entering the NID 10. As shown and described herein, the first port 25 for receiving the feeder cable is located adjacent the hinged side of the base 12 and outer cover 14, and the second port 27 for receiving the distribution cable is located adjacent the side of the NID 10 opposite the hinges 13. The first port 25 and the second port 27, however, may be located at any convenient location relative to the interior cavity 24 of the NID 10. The first port 25 and the second port 27 may also be combined into a single entry port 26 for receiving both the feeder cable and the distribution cable.

As shown in FIG. 3, the NID 10 further comprises an inner cover 30 positioned over the portion of the termination equipment and the wiring connections belonging to the service provider that is housed within the interior cavity 24 defined by the base 12. The inner cover 30 is configured to be releasably secured and movably attached to the base 12 of the NID 10 between a closed position and an opened position. For example, a locking screw 37 that requires an industry specific tool to remove may be utilized to releasably secure the inner cover 30 to the base 12. Accordingly, the inner cover 30 prevents unauthorized access to the portion of the terminating equipment and the wiring connections belonging to the service provider that is housed within the interior cavity 24 of the NID 10. Furthermore, the inner cover 30 may be attached to the base 12 by a series of hinges 33 located along one side of the base 12 and the inner cover 30. Accordingly, the inner cover 30 pivots about the hinges 33 between the closed position and the opened position to provide access to the portion of the terminating equipment and wiring connections belonging to the service provider housed within the interior cavity 24 of the NID 10. Access to the portion of the terminating equipment and wiring connections belonging to the subscriber is not obstructed by the inner cover 30. The terminating equipment belonging to the subscriber may comprise any known apparatus for terminating the distribution cable, such as solder terminals or insulation displacement contacts (IDCs). As shown, the terminating equipment belonging to the subscriber comprises a plurality of screw terminals 35 arranged in transmit (tip) and receive (ring) pairs that are electrically connected to the terminating equipment belonging to the service provider. Accordingly, communications equipment belonging to the subscriber may be terminated to the feeder cable in a conventional manner without access to the terminating equipment belonging to the service provider housed within the interior cavity 24 of the NID 10 beneath the inner cover 30. As will be readily appreciated, the inner cover 30 is optional and may be eliminated entirely when access to the NID 10 is otherwise restricted to authorized personnel, or when the subscriber requires unobstructed access to the terminating equipment and wiring connection belonging to the service provider.

As shown in FIG. 3, the continuous wall 22 of the base 12 comprises a first side wall 42 adjacent the hooks 15, a second side wall 44 adjacent the hinges 33, a top wall 46 extending between the first and second side walls 42, 44, and a bottom wall 48 extending between the first and second side walls 42, 44. The first and second side walls 42, 44 of the base 12 are spaced apart by the top wall 46 and the bottom wall 48. Likewise, the top wall 46 and the bottom wall 48 of the base 12 are spaced apart by the first and second side walls 42, 44. Thus, the first side wall 42, the top wall 46, the second side wall 44 and the bottom wall 48 form a continuous periphery that encloses the interior cavity 24 defined by the base 12. Similarly, the outer cover 14 comprises a first side wall 52 adjacent the snaps 16, a second side wall adjacent the hinges 13, a top wall 56 extending between the first and second side walls 52, 54, and a bottom wall 58 extending between the first and second side walls 52, 54. The first and second side walls 52, 54 of the outer cover 14 are spaced apart by the top wall 56 and the bottom wall 58. Likewise, the top wall 56 and the bottom wall 58 of the outer cover 14 are spaced apart by the first and second side walls 52, 54. Furthermore, the first and second side walls 52, 54 of the outer cover 14 are opposite the first and second side walls 42, 44, respectively, of the base 12 when the cover is in the closed position. Likewise, the top wall 56 of the outer cover 14 is opposite the top wall 46 of the base 12 and the bottom wall 58 of the outer cover 14 is opposite the bottom wall 48 of the base 12 in the closed position. Thus, the first side wall 52, the top wall 56, the second side wall 54 and the bottom wall 58 form a continuous periphery that encloses the interior cavity 24 defined by the base 12 when the outer cover 14 is in the closed position.

Figure 4:
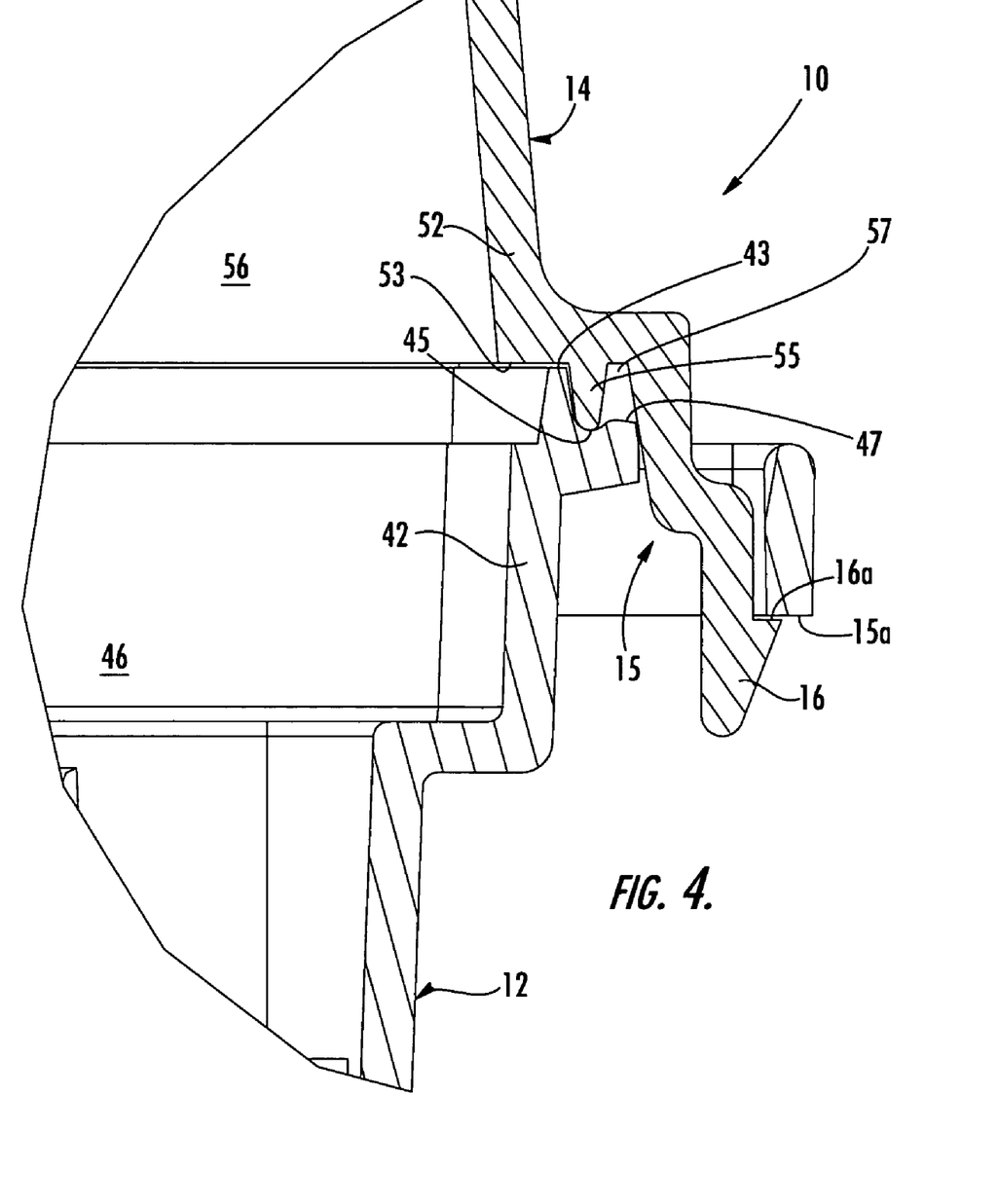
FIG. 4 is a sectional view of the NID of FIG. 1 taken along the line 4-4 in FIG. 2.

FIG. 4 is a sectional view of the NID 10 taken transversely through the upper snap 16 of the outer cover 14 and the upper hook 15 of the base 12. FIG. 4 illustrates an environmental seal that is formed when the outer cover 14 is in the closed position on the base 12. In particular, the first side wall 42 of the base 12 has a small radius channel 45 formed therein adjacent the surface 43 of the first side wall 42 that contacts the surface 53 of the first side wall 52 of the outer cover 14 when the outer cover 14 is closed on the base 12. The first side wall 52 of the outer cover 14 comprises a corresponding lip 55 that depends outwardly from the outer cover 14 adjacent the surface 53 of the first side wall 52 so that the lip 55 is opposite the channel 45 when the outer cover 14 is in the closed position. Due to the resiliency of the material of the outer cover 14 and the relatively thin cross section of first side wall 52, the snap 16 draws the lip 55 into the channel 45 when snap 16 flexes, and thereby biases ledge 16a of snap 16 against seat 15a defined by hook 15 formed in base 12. Channel 45 and lip 55 extend along the entire length of first side wall 42 of base 12 and first side wall 52 of outer cover 14, respectively. Channel 45 and lip 55 likewise extend along the entire length of second side wall 44 of base 12 and second side wall 54 of outer cover 14. Channel 45 and lip 55 likewise extend along the entire length of top wall 46 of base 12 and the top wall 54 of outer cover 14, respectively. As previously mentioned, second side wall 44 opposes second side wall 54 and top wall 46 opposes top wall 56 when the outer cover 14 is closed on the base 12. Thus, the channel 45 extends continuously along the first side wall 42, the top wall 46 and the second side wall 44, and the lip 55 extends continuously along the first side wall 52, the top wall 56 and the second side wall 54. As a result, the channel 45 and the lip 55 form a continuous substantially watertight seal, as will be described, across the top and along the sides of the NID 10.

Figure 5:
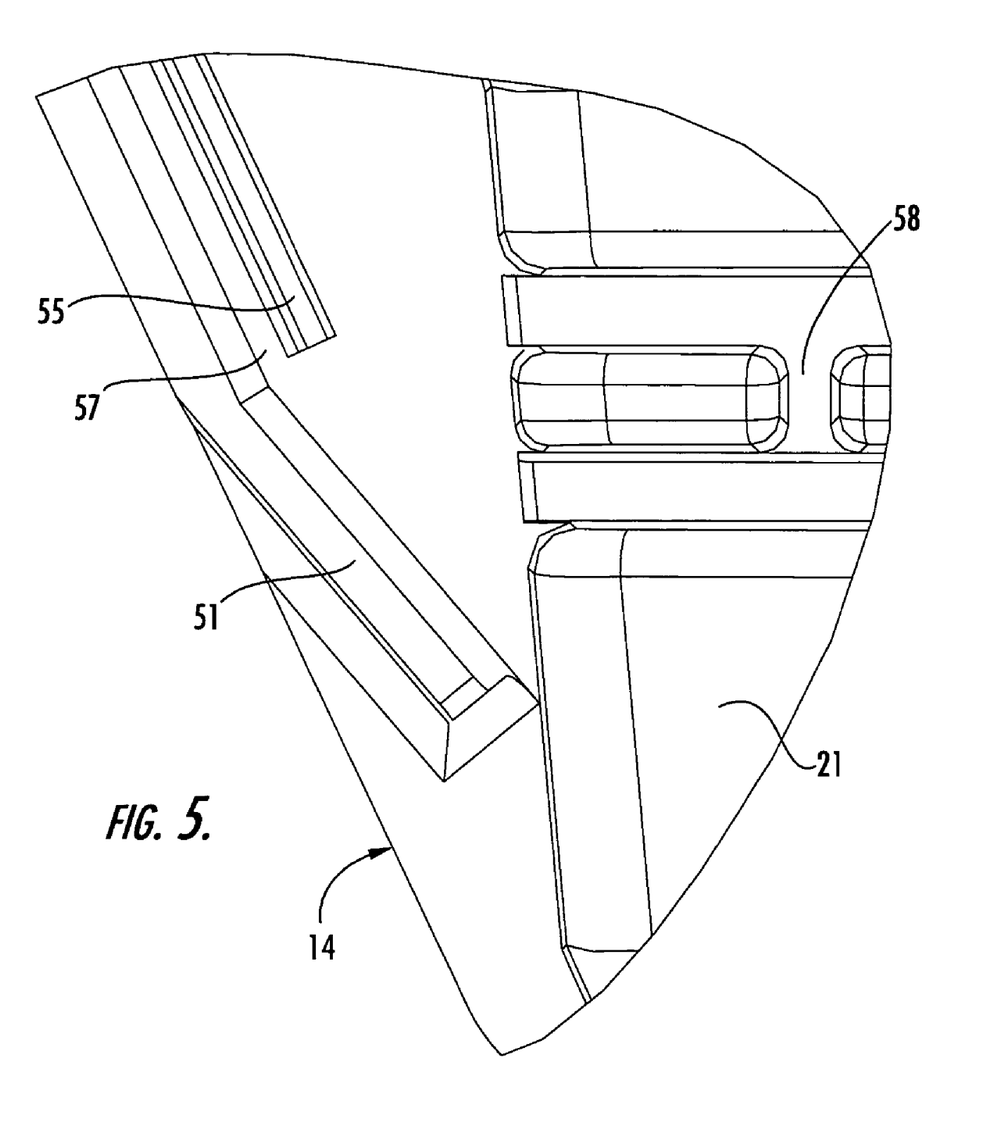
FIG. 5 is an enlarged detail view of a portion of the base of the NID of FIG. 1, as indicated by the numeral 5 in FIG. 3.
Figure 6:
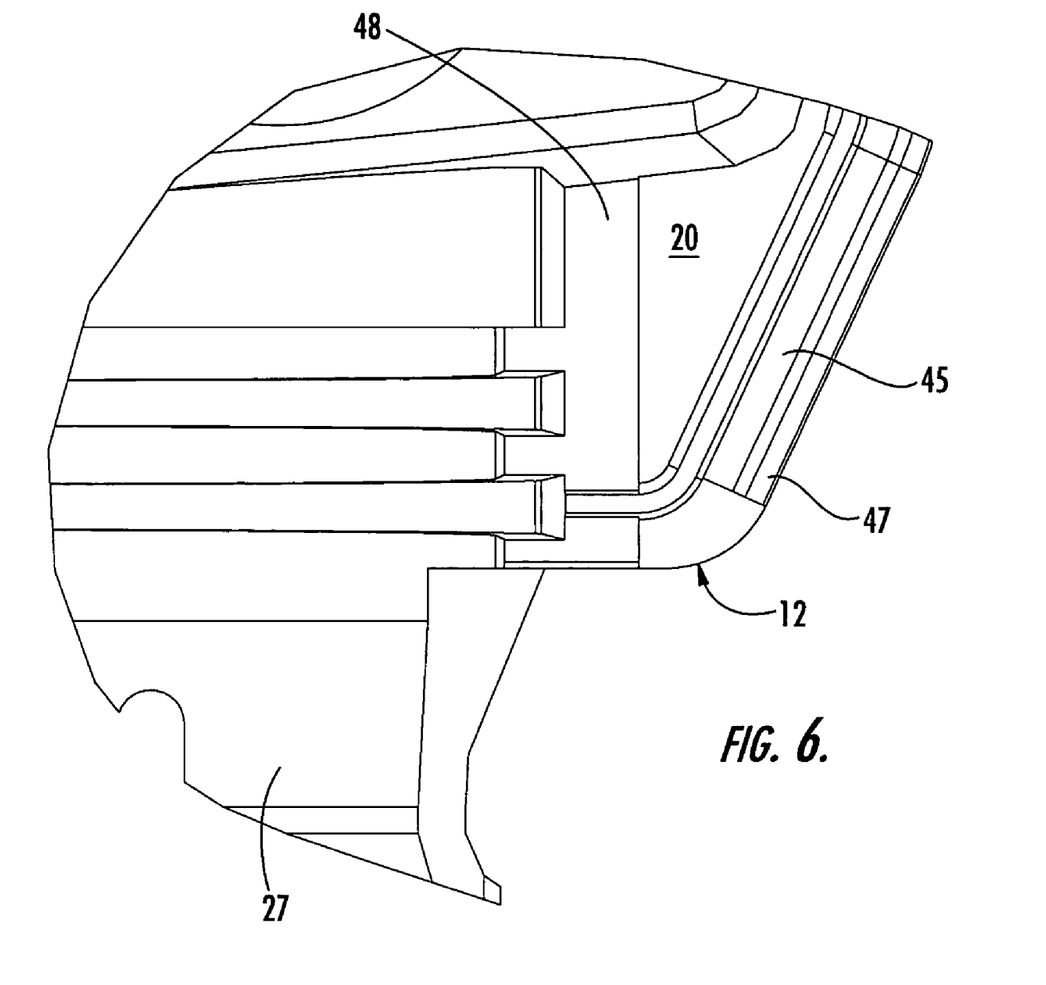
FIG. 6 is an enlarged detail view of a portion of the outer cover of the NID of FIG. 1, as indicated by the numeral 6 in FIG. 3.

As shown in FIG. 5, the lip 55 on the first side wall 52 terminates adjacent the bottom wall 58 of the outer cover 14. A small opening 57 is defined between the lip 55 and the outer edge 51 of first side wall 52 to permit any moisture that accumulates against the outside of the lip 55 to drain along the outer edge 51 towards recess 21 adjacent port 27. As previously described, port 27 is sealed with an end cap, grommet, gel or grease to prevent moisture from entering the interior cavity 24 of the NID 10. Furthermore, the NID 10 is installed in a vertical orientation, as illustrated in FIG. 2, such that the force of gravity causes any moisture along the bottom wall 48 of the base 12 and the bottom wall 58 of the outer cover 14 in the vicinity of port 27 to drain downwardly away from the interior cavity 24 of the NID 10. As shown in FIG. 6, the channel 45 on the first side wall 42 likewise terminates adjacent the bottom wall 48 of the base 12. The channel 45, however, extends slightly farther in the direction of port 27 than the lip 55. Base 12 further comprises a surface 47 adjacent channel 45 that is opposite opening 57 when outer cover 14 is closed on base 12 (FIG. 4). Accordingly, any moisture that accumulates in opening 57 between lip 55 and outer edge 51 drains along surface 47 of base 12 towards port 27. At the point adjacent port 27 where outer edge 51 and channel 45 meet, the moisture that accumulates in opening 57 drains harmlessly from the NID 10 under the influence of gravity without entering interior cavity 24.

As shown and described herein, the NID 10 permits the service provider access to the terminating equipment and to the wiring connections between the network and the subscriber, and in particular, provides direct access for installation, service, repair, reconfiguration and test operations. The NID 10 also serves as the required demarcation point between the network feeder cable and the subscriber distribution cable. The NID 10 comprises a base 12 having a channel 45 formed therein and an outer cover 14 comprising a lip 55 that depends outwardly from the outer cover 14 and is received within the channel 45. In preferred embodiments of the NID 10, the interaction of the channel 45 and the lip 55 produce a substantially watertight seal around the periphery of the NID 10 when the outer cover 14 is closed on the base 12. The watertight seal prevents moisture from entering the interior cavity 24 defined by the base 12, and thereby protects the terminating equipment and wiring connections housed within the NID 10. As a result, the NID 10 meets or exceeds existing sever rain tests, and in particular, the GR-487-CORE wind-driven rain test that has been proposed as a standard requirement for all new outside NID products, while avoiding the costs associated with the use of an elastomeric gel, seal or gasket.

Although the NID 10 shown in FIGS. 1-6 and described hereinabove provides an environmental seal between the base 12 and the outer cover 14 that is sufficient to satisfy the rigorous GR-487-CORE wind-driven rain test, the substantially watertight seal may not be sufficient under certain circumstances to satisfy an equally sever wind-driven dust and sand test, such as GR-49-CORE. In particular, a watertight and airtight seal will be provided only if exceptionally tight tolerances are maintained on the flatness and the straightness of the mating surfaces, thereby permitting the outer cover 14 to close tightly on the base 12 around the entire periphery of the first side wall 42, the second side wall 44 and the top wall 46. As best seen in FIG. 4, it is possible that a slight gap may exist between the channel 45 formed in the base 12 and the opposing surface of the lip 55 formed on the outer cover 14. Likewise, it is possible that a slight gap may exist between the surface 43 of first side wall 42 of base 12 and the opposing surface 53 of first side wall 52 of the outer cover 14. While a watertight and airtight seal is typically assured in the vicinity of the hooks 15 and snaps 16, it is less likely that an airtight seal will be maintained around the entire periphery of the first side wall 42, the second side wall 44 and the top wall 46 of the base 12 where the snaps 16 do not engage the hooks 15 to draw the outer cover 14 against the base 12. An elastomeric seal or gel material may be positioned between the mating surfaces of the base 12 and the outer cover 14 to maintain the environmental seal around the entire periphery of the base 12. However, as previously mentioned, the addition of an elastomeric gel, seal or gasket unnecessarily increases the material, manufacturing, and assembly costs associated with the NID.

Figure 7:
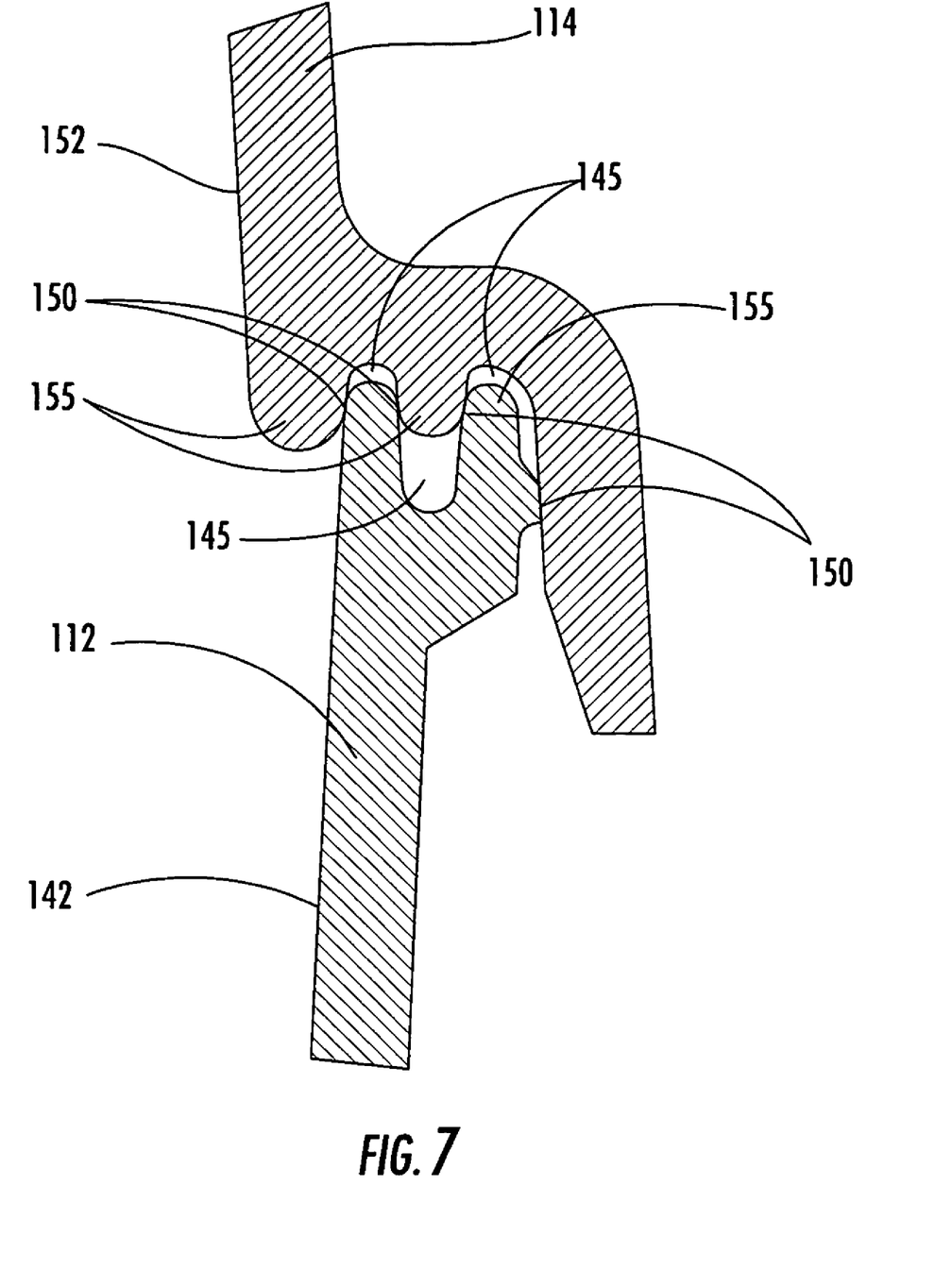
FIG. 7 is a sectional view similar to FIG. 4 of another exemplary NID having an environmental seal constructed in accordance with the invention and shown with the protective outer cover closed on the base.

FIG. 7 is a sectional view, similar to the sectional view shown in FIG. 4, of another exemplary NID 100 having an environmental seal constructed in accordance with the invention. As in FIG. 4, the NID 100 illustrated in FIG. 7 is shown with the protective outer cover 114 closed on the base 112. Unlike FIG. 4, the section of the NID 100 shown in FIG. 7 is taken transversely through the first wall 142 of the base 112 and the first wall 152 of the outer cover 114 at a location other than the location of a snap 16 and hook 15. The section of the NID 100 may be taken at any other location, for example at a location between the upper snap 16 and the top wall 156 of the outer cover 114. The section of the NID 100 is not taken at the location of a snap 16 and hook 15 for purposes of clarity to demonstrate that the effectiveness of the environmental seal provided by NID 100 does not depend on the snap 16 engaging the hook 15 to draw the outer cover 114 tightly against the base 112. As shown in FIG. 7, the first side wall 142 of the base 112 comprises one or more relatively small radius channels 145 for receiving a corresponding lip 155 depending outwardly from the first side wall 152 of the outer cover 114 when the outer cover is closed on the base 112. As will be appreciated by those of ordinary skill in the art, the base 112 and the outer cover 114 may also be viewed as each comprising one or more channels 145 for receiving a corresponding lip 155 depending outwardly from the other in a conventional "tongue and groove" fashion when the outer cover 114 is closed on the base 112.

In the NID 10 shown in FIG. 4, the channel 45 and the corresponding lip 55 define a single "vertical" point of contact formed where the radiused portion of the lip 55 on the underside of the outer cover 14 contacts the radiused channel 45 on the upper side of the base 12. In contrast, multiple "lateral" points of contact, indicated at 150, are formed when the side portions of a lip 155 provided on the base 112 or the outer cover 114 contact the side portions of a corresponding channel 145 on the other of the base 112 or the outer cover 114. Because the side portions of the lip 155 contact the side portions of the corresponding channel 145, the effectiveness of the environmental seal of the NID 100 is more consistent and does not depend on how tightly the outer cover 114 is closed on the base 112. Although not required, the channels 145 and the lips 155 may be tapered to facilitate insertion of the lip 155 into the corresponding channel 145 and to insure adequate contact between the side portions of the lip 155 and the side portions of the corresponding channel 145. The one or more channels 145 formed in one of the base 112 and the outer cover 114, and the corresponding one or more lips 155 formed in the other of the base 112 and the outer cover 114 extend at least partially around the periphery of the base 112 and the outer cover 114. In a preferred embodiment, the channels 145 and the corresponding lips 155 extend continuously along substantially the entire length of the first side wall, the top wall and the second side wall of the base 112 and the outer cover 114, as previously described, and the channels 145 and the lips 155 terminate on the first side wall and the second side wall adjacent the bottom wall of the base 112. Regardless, the lips 155 are received within the corresponding channels 145 to form a substantially airtight and watertight seal that prevents wind-driven dust, sand and moisture from entering the interior cavity defined by the base 112 when the outer cover 114 is in the closed position.

Although preferred embodiments of the invention have been shown and described herein, many modifications and other embodiments of the invention will readily come to mind to one skilled in the art to which this invention pertains, and particularly, to one skilled in the art having the benefit of the teachings presented in the foregoing description and accompanying drawings. Therefore, it is to be understood that the invention is not intended to be limited to the specific embodiments disclosed herein and that further modifications and other embodiments are intended to be included within the scope of the appended claims. Although specific terms are employed herein, they are used in a generic and descriptive sense only and not for purposes of limitation.

That which is claimed is:

1. An enclosure for protecting terminating equipment and wiring connections against adverse environmental conditions, the enclosure comprising:
    a base defining an interior cavity for housing the terminating equipment and wiring connections, the base comprising a pair of side walls spaced apart by a top wall and a bottom wall;
    a protective outer cover attached to the base for movement between an opened position and a closed position, the outer cover comprising a pair of side walls opposite the side walls of the base in the closed position, a top wall opposite the top wall of the base in the closed position and a bottom wall opposite the bottom wall of the base in the closed position;
    one or more channels formed in each of the base and the outer cover, the channels extending at least partially along the side walls and the top wall of the base and the outer cover, the channels terminating adjacent the bottom wall of the base and the outer cover;
    one or more lips depending from the base and the outer cover, the lips extending at least partially along the side walls and the top wall of the base and the outer cover, the lips terminating adjacent the bottom wall of the base and the outer cover, the lips being received within the channels to form an environmental seal when the outer cover is in the closed position; and
    an inner cover movably attached to the base for preventing unauthorized access to a portion of the terminating equipment housed within the interior cavity defined by the base.

2. An enclosure according to claim 1 wherein one of the base and the outer cover has a hook and the other of the base and the outer cover has a resilient snap for engaging the hook to secure the outer cover on the base in the closed position.

3. An enclosure according to claim 1 wherein the channels formed in the base and the outer cover extend continuously along the side walls and across the top wall of the base and the outer cover.

4. An enclosure according to claim 3 wherein the lips depend outwardly from the base and the outer cover and extend continuously along the side walls and across the top wall of the base and the outer cover.

5. An enclosure according to claim 1 further comprising means for releasably locking at least one of the outer cover and the inner cover to the base.

6. An enclosure according to claim 5 wherein at least one of the outer cover and the inner cover is hinged to the base.

7. A network interface device comprising:
    a base comprising a first side wall, a second side wall, a top wall and a bottom wall, the top wall extending between the first side wall and the second side wall;
    an outer cover comprising a first side wall opposite the first side wall of the base, a second side wall opposite the second side all of the base and a top wall opposite the top wall of the base;
    wherein a plurality of lips depending outwardly from the base and the outer cover are received within a corresponding channel formed in the other of the base and the outer cover such that side portions of the lips engage side portions of the corresponding channel to form an environmental seal; and
    an inner cover movably attached to the base for preventing unauthorized access to a portion of the terminating equipment housed within the interior cavity defined by the base.

* * * * *